(12) United States Patent
Hogle et al.

(10) Patent No.: US 6,397,157 B1
(45) Date of Patent: May 28, 2002

(54) METHOD AND APPARATUS FOR REAL TIME MEASUREMENT OF THREE PHASE ELECTRICAL PARAMETERS

(75) Inventors: Joseph A. Hogle; Michael G. Wise, both of Roanoke, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/347,309

(22) Filed: Jul. 2, 1999

(51) Int. Cl.[7] ................ G01R 25/00; G01R 27/00; G06F 19/00
(52) U.S. Cl. ................ 702/65; 702/60; 324/76.53; 324/86; 324/107
(58) Field of Search .................. 702/57–62, 64–66, 702/69–73, 75–79, 91–86, 117, 118, 124, 126, 183, 185, 188–190, 193, 197; 700/287, 293, 297, 298; 329/107, 108, 141, 142, 76.52, 76.53, 76.4, 86

(56) References Cited

U.S. PATENT DOCUMENTS

| | | | |
|---|---|---|---|
| 3,675,129 A | * 7/1972 | Melvin | 375/330 |
| 3,699,441 A | * 10/1972 | Linders | 324/86 |
| 4,210,948 A | 7/1980 | Waltz | 361/76 |
| 4,333,050 A | 6/1982 | Yeasting | 324/107 |
| 4,481,601 A | * 11/1984 | Heinle | 708/809 |
| 5,321,587 A | * 6/1994 | Moran | 363/41 |
| 5,337,206 A | 8/1994 | Kadah et al. | 361/85 |
| 5,497,332 A | 3/1996 | Allen et al. | 700/295 |
| 5,673,196 A | 9/1997 | Hoffman et al. | 702/65 |
| 5,854,995 A | 12/1998 | Plis et al. | 702/72 |

* cited by examiner

Primary Examiner—Marc S. Hoff
Assistant Examiner—Manuel L. Barbee
(74) Attorney, Agent, or Firm—Hunton & Williams

(57) ABSTRACT

An apparatus and method for determining, in real time, the key parameters of a three phase system electrical generator's output. A pair of reference vectors in quadrature (orthogonal) is phase-locked to a selected input open delta line to line voltage vector. Preferably, the cosine reference vector is locked 45° out of phase from the selected input vector whereby a best projection of the input vector onto the quadrature pair is provided and increases accuracy in subsequent magnitude and phase calculations. The phase-locked reference vectors provide a basis for computing the magnitude and phase angle for the remaining open delta line to line voltage vectors and three line to neutral current vectors. Instantaneous measurement of magnitude and phase angle for the three line to line voltages and three line to neutral currents, the generator's real power (watts), volt-amperes reactive (VARS), apparent power (VA), power factor (PF) and, as a result of the phase locking, the precise frequency of the generator are possible.

43 Claims, 9 Drawing Sheets

```
% Phas_45.m
% Force a phase shift of 45 degrees between input phasor
% and cos ref phasor for Gen_V_12 function y = phas_45(u)

global filtered_sin_proj;

% IF THE INPUT PHASOR LIES IN THE FIRST OR SECOND QUADRANT THEN
if (filtered_sin_proj < 0.0)

% CALCULATE THE ANGLE WITH RESPECT TO THE COS REFERENCE FOR EACH PHASOR
   angle = acos(u);

% ELSE INPUT PHASOR LIES IN THE THIRD OR FOURTH QUADRANT
else

%ACOS IS ONLY DEFINED IN RANGE OF 0 -> PI
   % IF IN QUADRANT 3 OR 4 COMPUTE ANGLE IN RANGE PI -> 2 PI
    angle = acos(u);
    angle = (2*pi) - angle;
end % THE ANGLE SHOULD BE SHIFTED 1/8 OF A ROTATION (45 DEG) FROM THE COS REF,
% FIND THE DIFFERENCE (ERROR) BETWEEN THE ANGLE AND DESIRED ANGLE.

% SUBTRACT 5.497787144 RADS (-7/8 OF A ROTATION i.e. -315 DEGS)
error = angle - 5.497787144;

% MAKE ANGLE ERROR POSITIVE BETWEEN 0-2 PI RADS
if (error < 0.0)
    error = error + 2*pi;
end % CONVERT ANGLE ERROR, OF THE INPUT PHASOR SHIFT FROM THE COS REF,
% FROM RADIANS TO FRACTION OF A REVOLUTION.
if (error < pi)
    y = error/(2*pi);
else
    y = error/(2*pi) - 1.0;
end
```

FIG. 8

METHOD AND APPARATUS FOR REAL TIME MEASUREMENT OF THREE PHASE ELECTRICAL PARAMETERS

BACKGROUND OF THE INVENTION

The present invention is directed to real time measurement of balanced or unbalanced three phase electrical parameters such as power, voltage, current and frequency. Specifically, the invention is directed to real time measurement of balanced or unbalanced three phase electrical parameters of electrical power generators using a phase-locked quadrature detector.

Polyphase and, more particularly, three-phase power generators are widely used to produce electric power for commercial and industrial use and it is highly desirable, therefore, that such generators produce AC power that is both stable and reliable. Since such generators are often subject to various types of power surges, faults, voltage and current overloads, as well as phase and frequency perturbations, it is desirable to monitor as closely as possible the output parameters of the generator. Specifically, during the operation of an electrical power generator, it is desirable for the safe operation of the system that the generator's operating parameters be available to the operator and as a safeguard provide feedback signals to the system control in the event that there develops an unsafe condition of, for example, a mismatch between input mechanical drive power and electrical power being delivered.

Some prior art electrical power generator monitors e.g., General Electric's Mark V Turbine Control Card DS200TCCBG1B, assume that, in a three phase system, monitored voltage and current signals have a 120 degree phase relationship between each of the voltage and current vectors. However, in the event of an unbalance in the system, the 120 degree phase relationship no longer is a valid assumption. Accordingly, any vector measurements and power calculations based on the assumed 120 degree relationship also are no longer valid.

A further presumption in other prior art generator monitors is that the frequency of power generation is maintained at a rated system frequency, e.g., 50 or 60 Hz. This assumption is generally true especially when the generator is connected a relatively large power grid whereby the generator experiences an electrical "stiffness" tending to keep the frequency close to the nominal frequency. On the other hand, where an electrical power generator is not connected to a larger electrical grid, e.g., a manufacturing facility having its own generating capacity and where power machinery is turned on and off, or even in certain less developed countries where the power distribution system is not entirely reliable, 4 to 5 Hz variations in frequency from the nominal value is not uncommon. Phase unbalance and frequency variations, however, can cause undesirable effects in rotating machinery, electronic equipment and other apparatus relying on the generated electricity.

SUMMARY OF THE INVENTION

It is therefore seen to be desirable to provide an apparatus and method for determining, in real time, the key parameters of a three phase electrical generator's output. In accordance with a preferred embodiment of the invention a pair of reference vectors in quadrature (orthogonal) is phase-locked to a selected input open delta line to line voltage vector. Preferably, the cosine reference vector is locked 45° out of phase from the selected input vector. This allows the best projection of the input vector onto the quadrature pair providing increased accuracy in subsequent magnitude and phase calculations. The phase-locked reference vectors provide a basis for computing the magnitude and phase angle for the remaining open delta line to line voltage vectors and three line to neutral current vectors, all of which also are provided as inputs to the system of the preferred embodiment. Using the calculated magnitude and phase of selected inputs, instantaneous measurement of magnitude and phase angle for the three line to line voltages and three line to neutral currents, the generator's real power (watts), volt-amperes reactive (VARS), apparent power (VA), power factor (PF) and, as a result of the phase locking, the precise frequency of the generator.

BRIEF DESCRIPTION OF THE DRAWINGS

FIG. 8 illustrates a preferred set of instructions to implement error function block 200a, in accordance with the invention.

DETAILED DESCRIPTION OF PREFERRED EMBODIMENTS

Figure 1A:
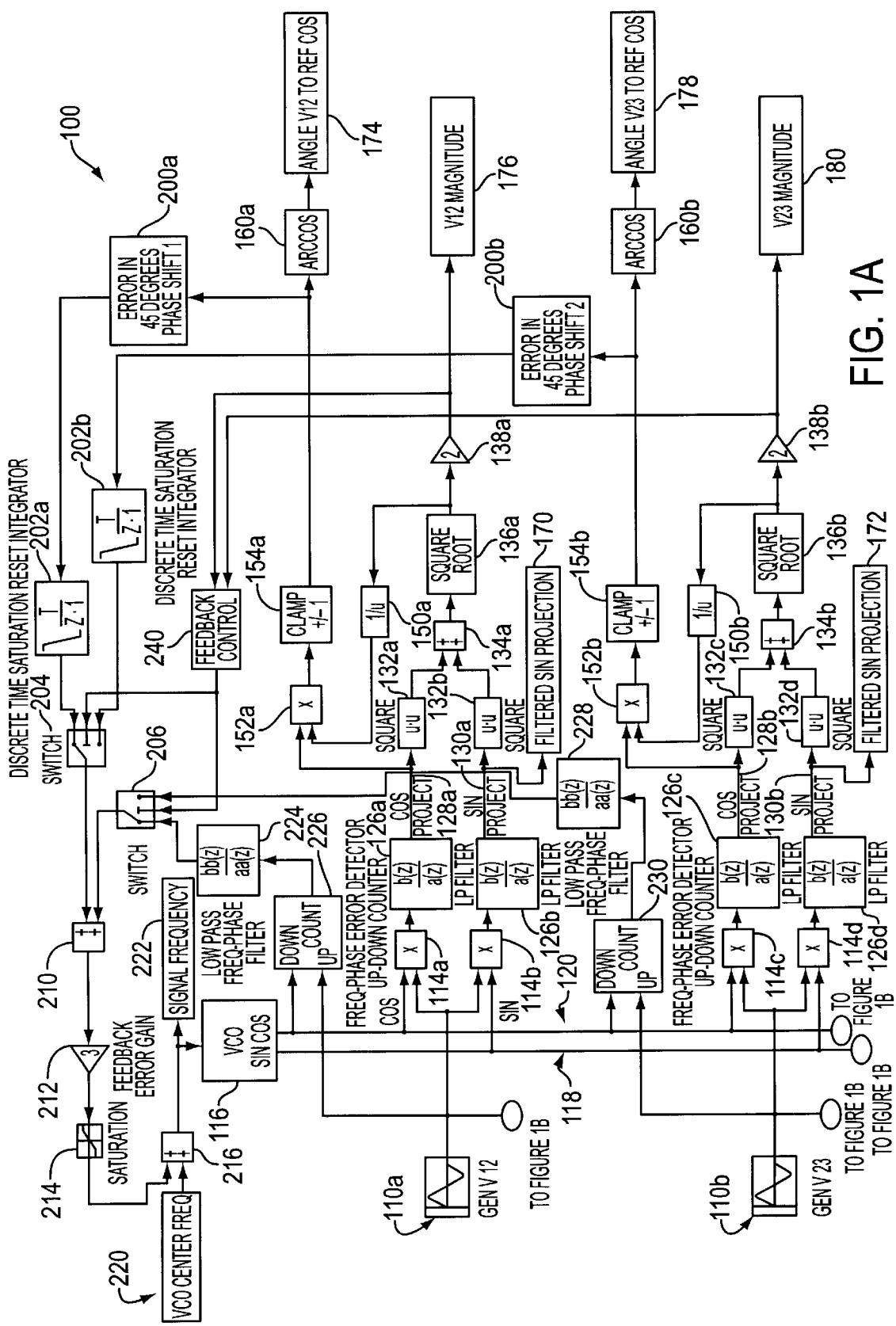
FIGS. 1A and 1B depict schematically a preferred embodiment of the present invention.
Figure 1B:
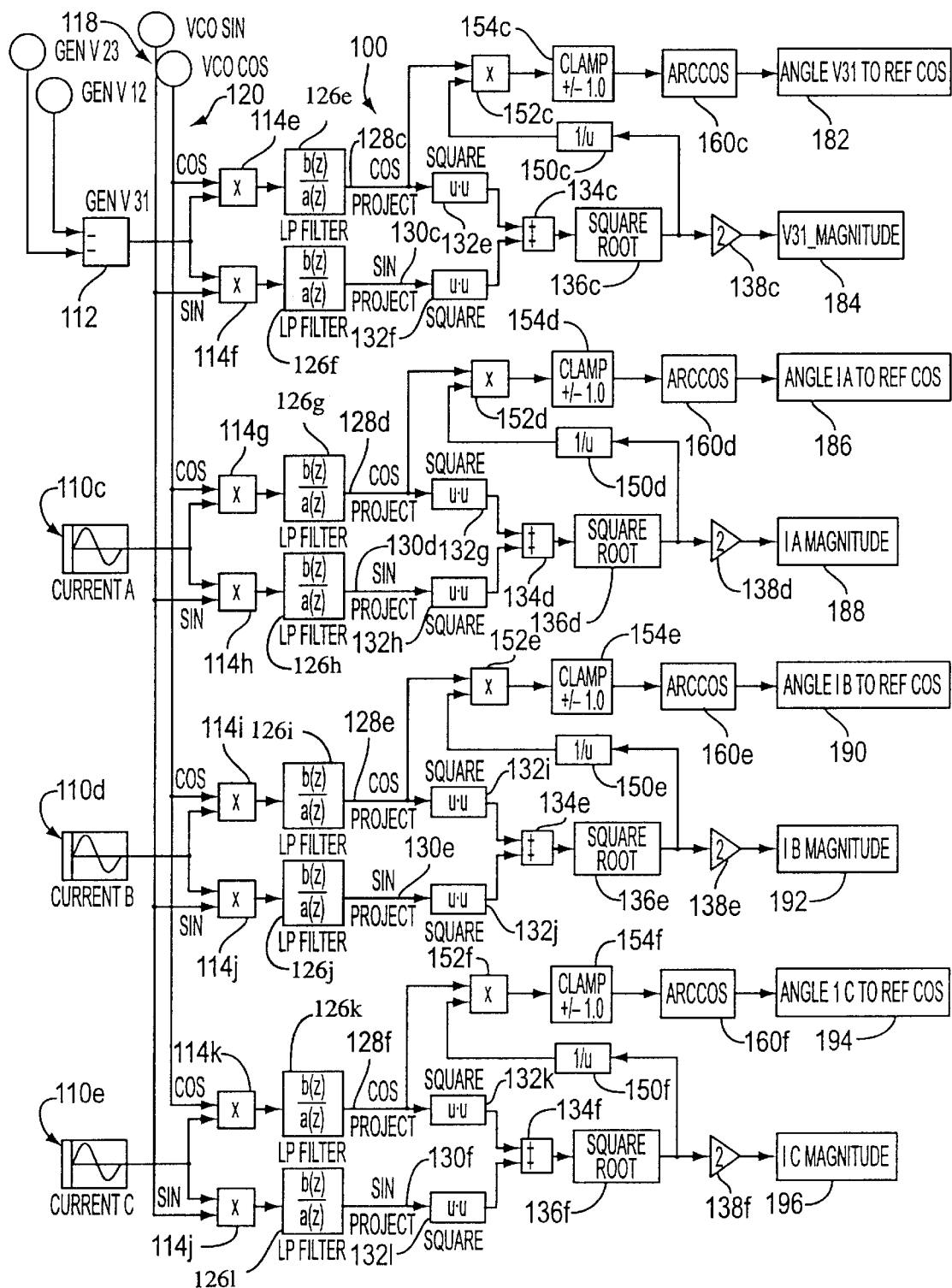

A preferred embodiment of the present invention is indicated by 100 in FIGS. 1A and 1B. Generally speaking, there are three main functional portions in the preferred embodiment, namely, quadrature detectors, phase-locked loop and phase shifting feedback. Each will be discussed in turn below. FIG. 1A will be discussed first, but it is to be understood that much of the same functionality is repeated in FIG. 1B, albeit for different input signals.

The quadrature detector portion preferably comprises signal inputs 110a, 110b connected to multiplication blocks 114a, 114b, 114c, 114d, respectively, which are also connected to the reference sine 118 and cosine 120 signals exiting voltage controlled oscillator (VCO) 116. The multiplication blocks 114a, 114b, 114c, 114d each connected to low pass filters 126a, 126b, 126c, 126d, which are connected to squaring functions 132a, 132b, 132c, 132d for each of the sine 118 and cosine 120 signals. Further, there is provided summing junctions 134a, 134b, square root functions 136a, 136b, and gain blocks 138a, 138b which, together, combine to provide signal magnitudes 176, 180. The mathematics underlying the embodiment disclosed herein is discussed later.

In addition to the foregoing, the quadrature detector portion preferably comprises inverters 150a, 150b connected after the square root functions 136a, 136b, respectively, and multiplier blocks 152a, 152b which are respectively connected to clamping circuits 154a, 154b which, themselves, are ultimately connected to arc cosine functions 160a, 160b. The aforementioned aspect of the quadrature detector portion produces signals 174, 178 indicative of the input signal's phase relationship with respect to a reference vector, namely cosine signal 120. Finally, blocks 170, 172 indicate where a filtered projection of the input signal on the sine signal 118 can be obtained. The use of this filtered projection is explained later herein.

Figure 2:
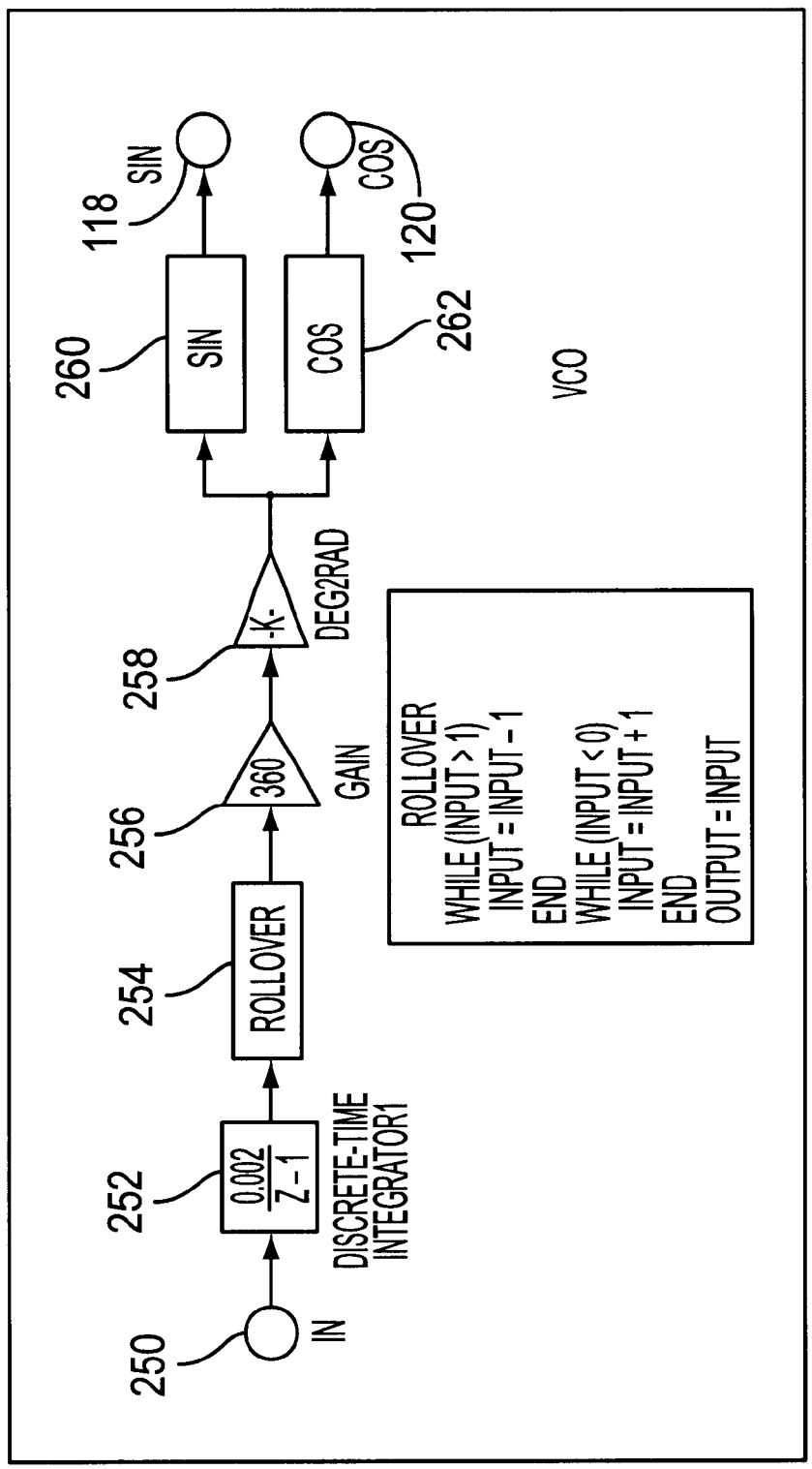
FIG. 2 shows an arrangement for a voltage controlled oscillator in accordance with a preferred embodiment of the present invention.

The phase locked loop in accordance with the preferred embodiment of the present invention comprises VCO 116 (shown in more detail in FIG. 2), up-down counters 226, 230, low pass filters 224, 228, a saturation limiter 214 and logic controlled switch 206 to select a desired feedback signal, as will be discussed in more detail later herein. The VCO 116, as depicted in FIG. 2, preferably is implemented digitally and comprises an input 250, a discrete time integrator 252, a rollover function 254, a gain block 256, a degree-to-radian converter 258 and sine 260 and cosine 262 function blocks leading, respectively, to sine and cosine signals 118, 120. The algorithm implemented in rollover function 254 is shown in FIG. 2.

The phase shifting feedback portion of the embodiment shown in FIG. 1A preferably comprises a function 200a, 200b to measure the phase angle difference between the selected input vector and the cosine reference signal 120. Any difference from the desired angle, in this case 45° (5.4978 radians), is converted to cycles, integrated via discrete time saturation reset integrators 202a or 202b, as enabled, and added (or subtracted) via summing block 210 through switch 204 as a bias to the frequency-phase error feedback to the VCO 116. That is, the frequency-phase error feedback is fed to summing block 216 which sums the error feedback with the VCO's center frequency 220. The adjusted frequency can be seen at 222 and the signal indicative of the signal frequency 222 is fed to VCO 116 via input 250 (FIG. 2). Inputs 110a, 110b represent open delta line to line voltage vectors indicated in FIGS. 1A and 1B by V12, V23 and V31. This notation is analogous to VAB, VBC and VCA in a three phase system having phases A, B, C. While the third line to line voltage of three phase system could be directly monitored through a conventional potential transformer (PT), in an effort to reduce the cost of an overall monitoring system, it can be seen, referring to FIG. 1B, that the third line to line voltage is derived by the negation of the other two line to line voltages via negation block 112. Like the two other voltages, the derived third voltage is mixed with sine and cosine signals 118, 120 via multiplication blocks 114e, 114f, the resulting products are filtered through filters 126e, 126f, the filtered components, namely, the cosine projection 128c, and sine projection 130c are passed through squaring functions 132e, 132f, the results of which are summed in summing block 134c and passed through a square root function 136c. The square root value is amplified by gain block 138c thereby obtaining the magnitude 184 of the third line to line voltage. The angle of the third line to line voltage with respect to the cosine reference signal 120 is obtained by inverting the square root value via inverter 150c and multiplying the resulting quotient with the cosine projection 128c in multiplier 152c. The resulting product is clamped to +/−1 in clamping function 154c and finally, an arc cosine function 160c is applied to the value exiting clamping function 154c, thereby obtaining angle output 182.

The arrangement for obtaining magnitudes and phase angles with respect to reference cosine signal 120 for the three phase currents is identical to the arrangement discussed above for the third line to line voltage.

Specifically, current signals enter at inputs 100c, 100d, 110e. Those signals are multiplied with the reference sine and cosine signals 118, 120 in multipliers 114g, 114h, 114i, 114j, 114k, 114l. The resulting products are filtered in low pass filters 126g, 126h, 126i, 126j, 126k, 126l resulting in respective cosine and sine projections 128d, 130d, 128e, 130e, 128f, 130f. Each of those projections is squared via the squaring functions 132g, 132h, 132i, 132j, 132k, 132l and summed together, as shown, in summing blocks 134d, 134e, and 134f. Thereafter, square root functions 136d, 136e, 136f are provided, which lead to gain blocks 138d, 138e, 138f, thereby resulting in the respective phase current magnitudes at 188, 192, 196. For the phase current angles with respect to the reference cosine signal 120, the cosine projection 128d, 128e, 128f is multiplied in multipliers 152d, 152e, 152f with the square root value inverted in inverters 150d, 150e, 150f. The product of this multiplication is clamped in clamping functions 154d, 154e, 154f, and an arc cosine function is applied by blocks 160d, 160e, 160f thereby resulting in the desired angles at 186, 190, 194.

As shown, the vector magnitudes and angles to be used in the power computations (FIG. 3) are determined using the cosine and sine projections 128a, 130a, 128b, 130b, 128c, 130c, 128d, 130d, 128e, 130e, 128f, 130f exiting the respective low pass filters in the quadrature detector portion. The square root of the sum of the squares of a pair of two projections is one half the magnitude of the input signal. Thus, the input signal's magnitude is found by multiplying this quantity by 2. See the mathematical analysis set forth later herein for a more rigorous explanation of the foregoing. Further, since the ratio of the cosine projection to the square root of the sum of the squares of the sine and cosine projections is the cosine of the angle between the input signal and the cosine reference, the phase relationship is found by taking the arc cosine of this ratio.

Figure 3:
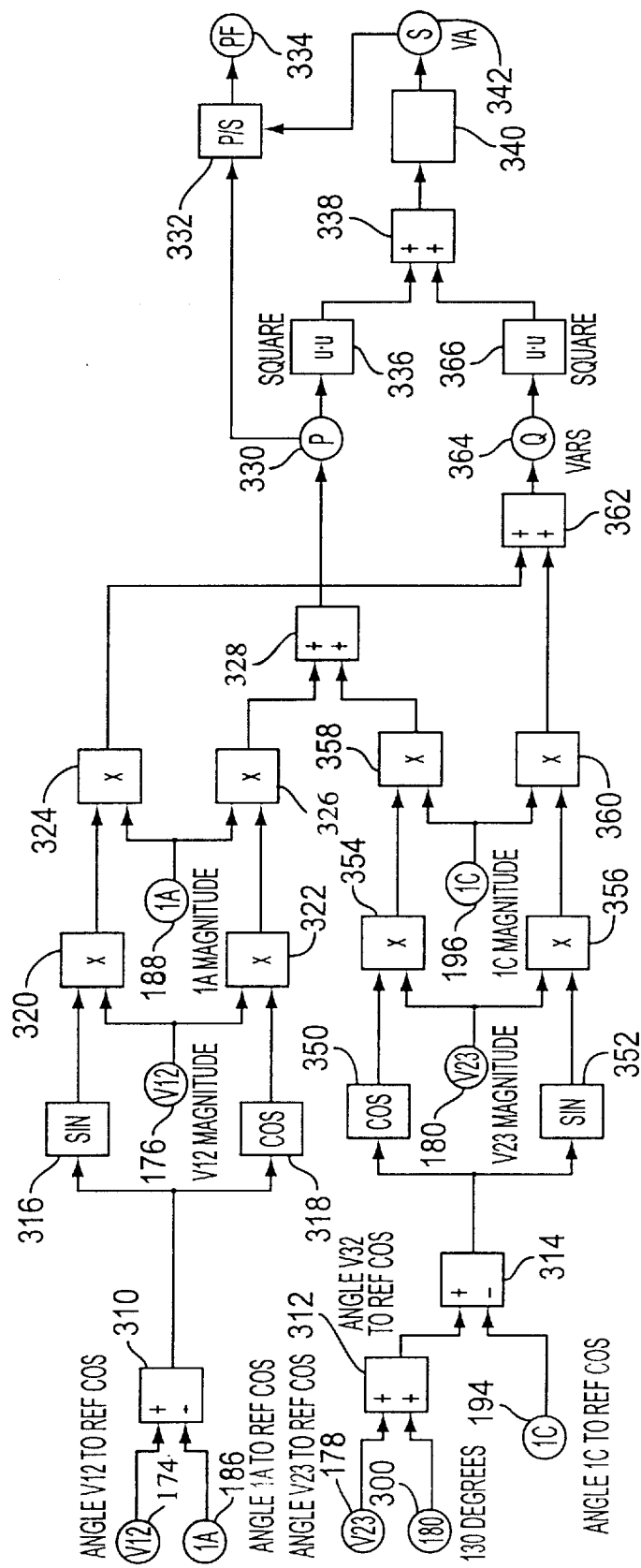
FIG. 3 depicts schematically an arrangement for obtaining various power parameters in accordance with an embodiment of the present invention.

The power calculations based on the derived vector magnitudes and phase relationships in accordance with the preferred embodiment is shown in FIG. 3. Specifically, angles 174, 186 are summed in summing block 310. The sine and cosine are taken of the resulting sum in blocks 316, 318. Those components are then mixed in multipliers 320, 322 with magnitude 176, which is the magnitude of the first line to line voltage. These products are again multiplied in multipliers 324, 326 with the phase A current magnitude of 188. Meanwhile, the second line to line voltage angle 178 and a 180° angle input 300 are summed in summing block 312 which provides the angle for the voltage between phases C and B with respect to the reference cosine signal 120. This value is added to the negative of the angle of the phase C current in block 314. That block is connected to sine and cosine functions 352, 350, respectively, whose outputs are mixed in multiplier blocks 354, 356 with the voltage magnitude between phases B and C 180. Blocks 354, 356 are connected to multipliers 358, 360 also having inputs connected to phase C current magnitude 196. The output of multiplier block 358 is summed with the output of multiplier block 326 in summing block 328 whose output is representative of the real power P 330. That real power value, when divided by S (described below), provides a power factor value 334. The apparent power (VA), labeled S in FIG. 3 is calculated as the square root of the sum of the squares of watts and VARS, i.e., $S=\sqrt{P^2+Q^2}$. In FIG. 3, this relationship is obtained by taking the outputs of multiplier blocks 324 and 360 and summing same in summing block 362, which provides the reactive power VARS, labeled Q, 364, in FIG.

3. Q is then squared in squaring function 366 as is the power P in squaring function 336. These squared values are added in summing block 338 and the square root of the resulting sum is taken in function block 340, resulting in the value S, apparent power VA.

Figure 4:
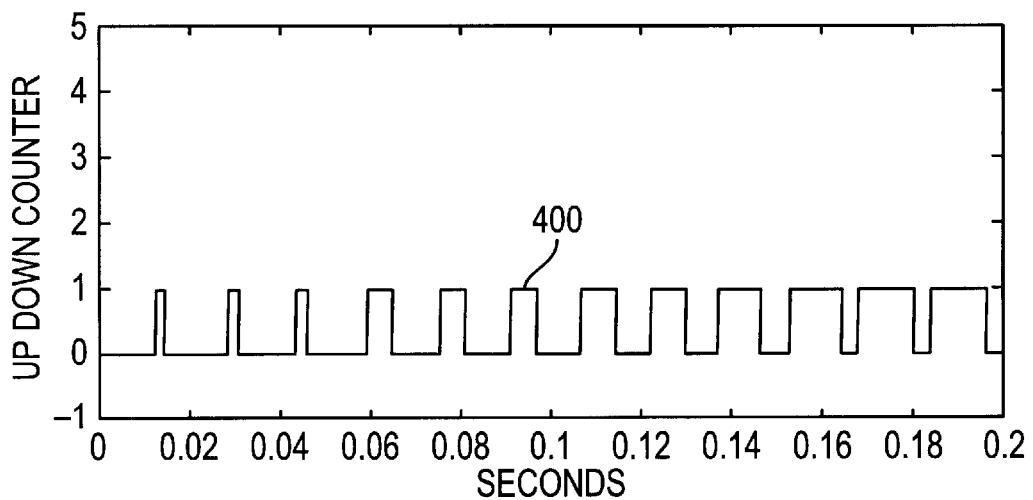
FIGS. 4–6 depict graphs of possible outputs of the up-down counter in the preferred embodiment of the present invention.
Figure 5:
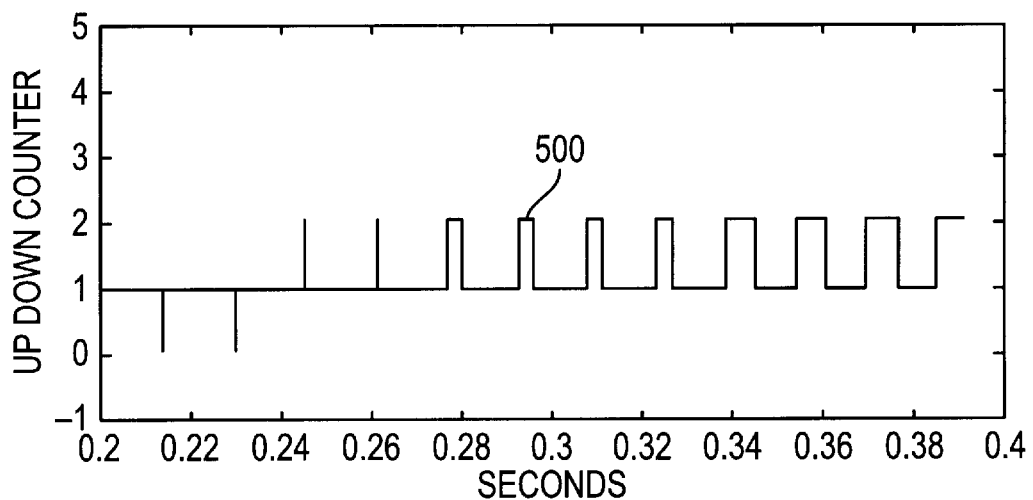
Figure 6:
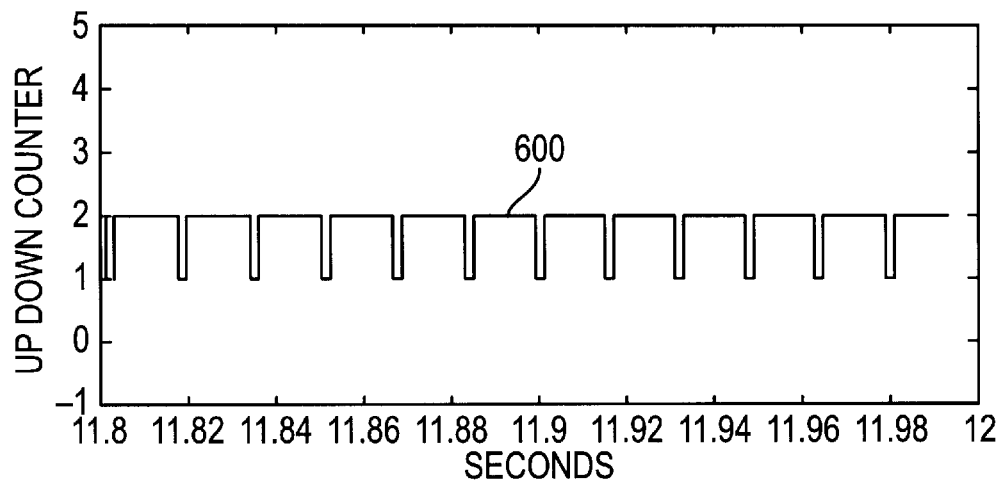

Operation of the system disclosed herein will be explained next. The phase locked loop is controlled by the operation of the frequency-phase error detector, which increments up-down counters 226, 230 with each zero crossing of the rising direction of the input signal, e.g., 110a, 110b. On the other hand, up-down counters 226, 230 are decremented with each zero crossing in the rising direction of the cosine reference vector 120. The counter 226, 230 counts up or down until it is within a fraction of a hertz necessary to add to the VCO center frequency to match the input signal's frequency. FIGS. 4, 5 and 6 depict possible counter output values. FIG. 4 depicts an up-down counter driving towards a higher frequency, FIG. 5 illustrates an up-down counter transition to a higher count and pulse width and FIG. 6 depicts an up-down counter locked at a steady state frequency. The fractional hertz required to maintain lock is embedded in the pulse width of the up/down counter. The output of the frequency phase up-down counters 226, 230 is smoothed by low pass filters 224, 228 and added to the phase shift feedback signal via switch 206. The summation of these two feedback signals with some gain via amplifier 212 to speed up the response, is used to bias the VCO center frequency 220 the desired amount to maintain the output of the VCO 116 at the same frequency as the input signal.

The phase shift feedback, that is, the error between the input signal vector and the cosine reference vector 120 and the desired phase shift (in this case 45°) is integrated via discrete time saturation reset integrators 202a, 202b and added to the appropriate filtered frequency-phase error up-down counter value at summing block 210. This phase shift feedback biases the summation of the two feedback signals such that the pulse width of the frequency-phase error up-down counter reaches a steady state equilibrium point with the input vector held at the desired phase angle relative to the cosine reference signal 120. The input signal's frequency is the sum of the feedback signal, with gain applied, and the VCO center frequency.

More specifically, the function 200a preferably is implemented in accordance with software code similar to that outlined in FIG. 8. As can be seen, the filtered sine projection, e.g. 170, is employed to assure the proper calculation result. The same algorithm is used in the function 200b feedback path except the 120 degrees difference between V12 and V23 is added to the desired difference making it 165 degrees versus the 45 degrees in the V12 path. Thus, in the V23 feedback path of the algorithm, 3.403392041 radians (195 degrees) is subtracted instead of the 5.497787144 radians (315 degrees) in the V12 path.

Figure 9:
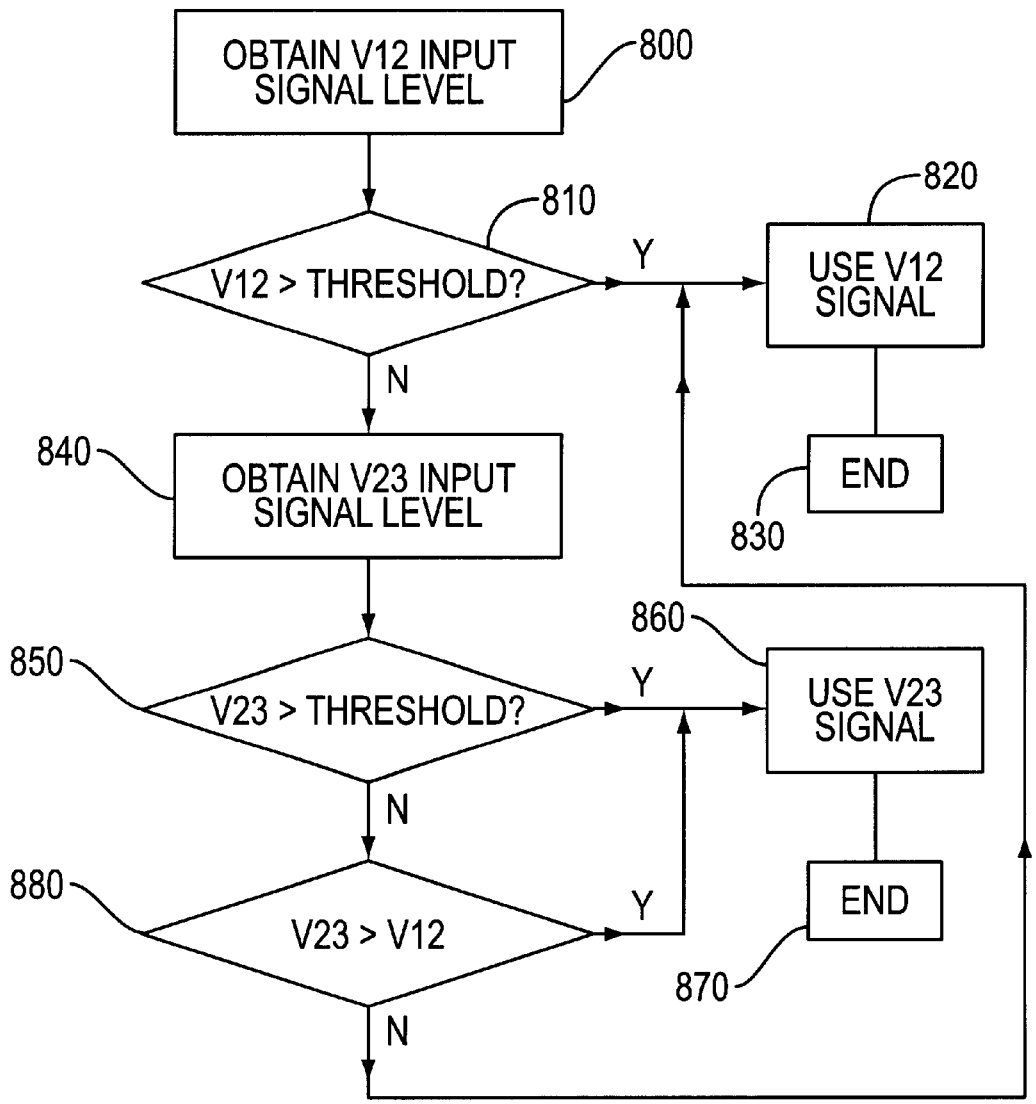
FIG. 9 shows a flow diagram representing a logic function for choosing to which input signal the reference is to be phase locked in accordance with an embodiment of the invention.

A feedback control switch 240 works in the following way with reference to FIG. 9. The normal feedback selection for the phase-locked loop is to use the V12 input signal 110a, as long as the magnitude of the input signal at 110a is greater than a predefined threshold (Steps 800, 810, 820, 830). If not, then the magnitude of V23, i.e., input signal 110b, is compared to the same threshold (Steps 840, 850). If the signal level of V23 is sufficiently large (Step 850), it is used as the feedback selection (Steps 860, 870). The switching for feedback control is implemented in block 240, shown in FIG. 1A. If neither V12 nor V23 exceeds the threshold, then if V23 is significantly greater than V12 (e.g., 150% or any other suitable value), V23 is used as the feedback selection (Steps 880, 860, 870). Otherwise, V12 is used. It should be noted that the default or primary use of V12 is arbitrary and that V23 could be used as the primary instead. This routine is repeated as appropriate to maintain confidence that the system is being monitored based on a "live" input signal. That is, this switching logic is useful in the case of a system fault and the subsequent loss of voltage in one or the other input signals. Accordingly, power calculations can be obtained as long as there is electrical power in one of the generator's phases.

To explain in another way, the discrete up-down counter, 226 or 230, provides a course, integer frequency adjustment by counting up or down, and fine frequency control by increasing or decreasing the pulse width. See FIGS. 5–7 to see the pulse widths increasing until an up count results or the pulse width remains constant and an equilibrium point is achieved. A similar effect is achieved with decreasing pulse width and down counts. The low pass filters 224, 228 immediately following the up-down counters smooth the counter output, and provide the average value of the up-down counter pulse train. Thus, a vernier (fractional) frequency component is embedded in the up-down counter pulse width. The problem is how to insure the input vector is held at a constant 45 degrees offset from the cosine reference signal 120. As previously noted, the 45-degree offset allows the projections on the reference cosine and sine reference phasors to be more balanced and provides for a more accurate measurement. The phase shifting feedback path ensures this desired relationship. By integrating any difference between the desired phase angle and the feedback input to cosine reference phase angle and then adding same to the up-down counter, there is provided the necessary bias to hold lock at the desired frequency and phase angle. In other words, the up-down counter will provide exactly the right feedback necessary to add to the VCO center frequency to maintain the VCO output frequency at the same frequency as the input (GEN V 12 or V 23). However the phase relationship is not controlled by any mechanism in the up-down counter feedback. By adding the phase shifting feedback path, the frequency and phase can be specified.

The following is a mathematical analysis of multiplication of vectors that can be used in conjunction with a preferred embodiment of the present invention.

MATHEMATICAL ANALYSIS OF MULTIPLICATION OF VECTORS

Multiplication of the input vector by either reference vector is governed by the following trigonometric identities.

$$[A_{in} \text{SIN}(\omega_{in}t+\phi_{in})][A_{ref} \text{SIN}(\omega_{ref}t+\phi_{ref})] = [(A_{in}A_{ref}/2)\text{COS}((\omega_{in}t+\phi_{in})-(\omega_{ref}t+\phi_{ref}))] - [(A_{in}A_{ref}/2)\text{COS}((\omega_{in}t+\phi_{in})+(\omega_{ref}t+\phi_{ref}))] \quad \text{(Eq. 1)}$$

For the two vectors at the same frequency, i.e. $\omega=\omega_{in}=\omega_{ref}$ then equation 1 becomes:

$$[A_{in} \text{SIN}(\omega_{in}t+\phi_{in})][A_{ref} \text{SIN}(\omega_{ref}t+\phi_{ref})] = [(A_{in}A_{ref}/2)\text{COS}(\phi_{in}-\phi_{ref})] - [(A_{in}A_{ref}/2)\text{COS}(2\phi t+\phi_{in}+\phi_{ref})] \quad \text{(Eq. 2)}$$

From this it is observed there is a D.C. term, i.e. the first bracket as well as an A.C. term, i.e. the second bracket. The D.C. term is present only when the two vectors are at the same frequency. If equation 2 is passed through a low pass filter to remove the A.C. component while passing the D.C. component, equation 2 will simplify as follows:

$$\text{Filtered } \{[A_{in} \text{SIN}(\omega t+\phi_{in})][A_{ref} \text{SIN}(\omega_{ref}t+\phi_{ref})]\} = [(A_{in}A_{ref}/2)\text{COS}(\phi_{in}-\phi_{ref})] \quad \text{(Eq. 3)}$$

If we chose to make our reference vector a unity vector, i.e. $A_{ref}=1$, equation 3 further simplifies to:

$$\text{Filtered } \{[A_{in} \text{SIN}(\omega_{in}t+\phi_{in})][A_{ref} \text{SIN}(\omega_{ref}t+\phi_{ref})]\} = [(A_{in}/2)\text{COS}((\phi_{in}-\phi_{ref})] \quad \text{(Eq. 4)}$$

Figure 7:
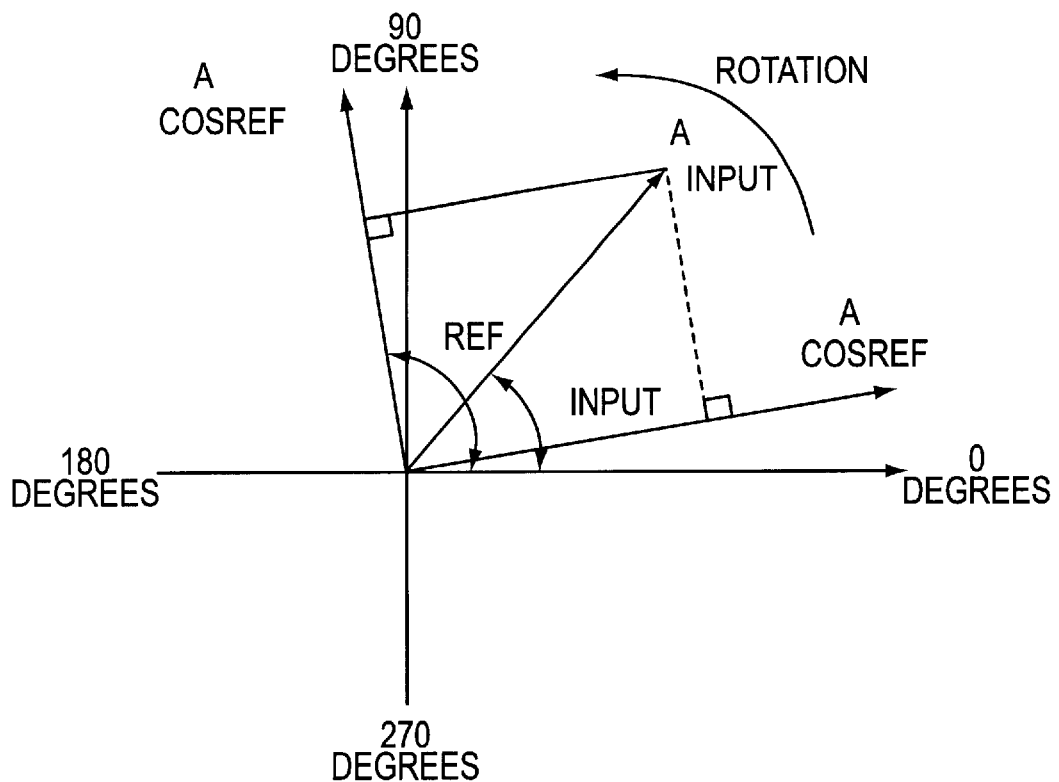
FIG. 7 shows the relationship between the input signal and generated cosine and sine reference signal components, once phase lock has been achieved.

It is now helpful to refer to FIG. 7.
By definition $$\cos((\phi_{in}-\phi_{ref})) \equiv (\text{adjacent/hypotenuse}) = (\text{projection of } A_{in} \text{ onto } A_{ref})/A_{in} \quad \text{(Eq. 5)}$$

Solving equation 5 for the term (projection of $A_{in}$ onto $A_{ref}$) yields $$(\text{projection of } A_{in} \text{ onto } A_{ref}) = A_{in} \cos(\phi_{in}-\phi_{ref}) \quad \text{(Eq. 6)}$$

Comparing equation 6 to equation 4, it is apparent that:

$$\text{Filtered } \{[A_{in}\sin(\omega_{in}t+\phi_{in})][A_{ref}\sin((\omega_{ref}t+\phi_{ref})]\} = (\text{projection of } A_{in} \text{ onto } A_{ref})/2 \quad \text{(Eq. 7)}$$

In other words the filter output is one half the projection of the input vector onto the reference vector.

Figure 10:
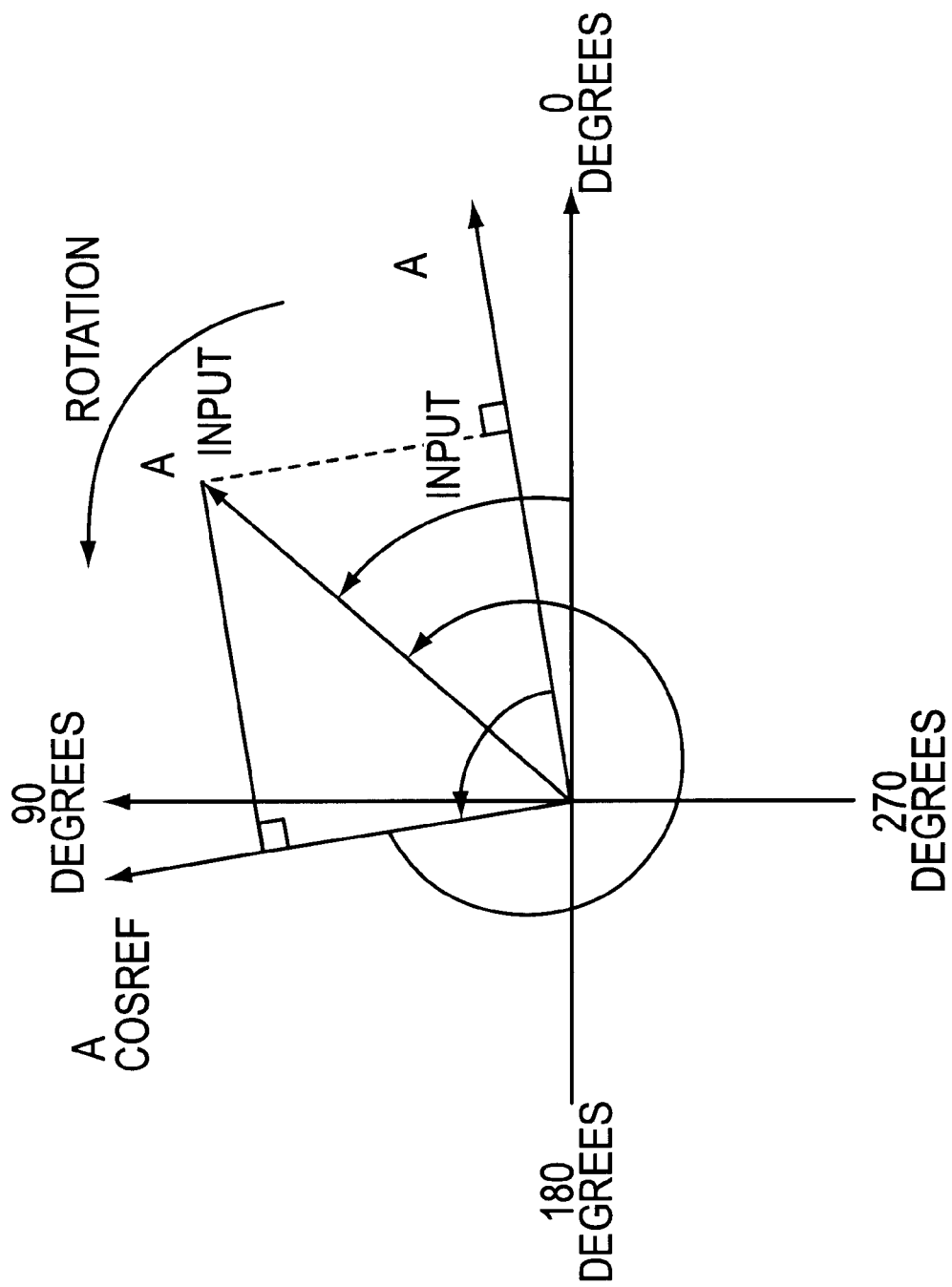
FIG. 10 shows the relationship among the phase angles of the various vectors in accordance with a preferred embodiment of the invention.

It is noted that, at angle outputs 174, 178, 182, 186, 190, 194, the angle output is the angle between the input vector (line-line voltage or line-neutral current) and the cosine reference signal 120. However, the true phase angle relative to a zero degree reference can be seen from FIG. 10 to be the cosine reference angle plus the angle between the cosine reference and the vector of interest modulo 360 degrees. That is, to provide the angle labeled "PHI INPUT" in FIG. 10 and FIG. 7 it would be necessary to add an arc cosine block in FIG. 1 (not shown) converting the cosine output 120 of the VCO 116 to an angle and do the calculation described above.

Thus, in accordance with the preferred embodiments discussed herein, there is provided a method and apparatus to accurately measure and compute in real time, and under conditions of both balanced and unbalanced loads, an electrical power generator's operating parameters including instantaneous frequency, three phase voltages, three phase currents, the relative angle between the phases, electrical power (watts, VARS, VA) and power factor. With a pair of vectors maintained in quadrature, locked, preferably at about 45 degrees, to a selected input and used as a common reference, all of the input vectors necessary to calculate the generator's operating parameters can be measured very accurately. The use of a common reference eliminates the problem of using an assumed phase angle and/or frequency and thus provides a more robust measurement scheme. Particularly, the technique of offsetting the input vector by 45 degrees from the reference quadrature pair and holding same at 45 degrees with a phase locked loop, provides an even more accurate ultimate measurement of electrical parameters. Accordingly, it is possible, for example, to provide accurate speed control to a prime mover of a generator to thereby more accurately control the frequency and/or phase of the electric power being delivered.

While the invention has been described with reference to preferred embodiments, it will be understood by those skilled in the art that various changes may be made and that equivalents may be substituted for elements thereof without departing from the scope thereof. In addition, many modifications may be made to adapt a particular situation or material to the teachings herein without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for analyzing a polyphase electrical system, comprising the steps of:
   measuring at least one phase of said polyphase electrical system to obtain a measured vector;
   generating a pair of reference vectors in quadrature;
   phase locking said reference vectors at a predetermined angle offset from said measured vector; and
   based on a projection of said measured vector on one of said reference vectors, calculating at least one of voltage or current magnitude, voltage or current phase and frequency.

2. The method of claim 1, wherein said predetermined angle is about 45 degrees.

3. The method of claim 1, further comprising incrementing and decrementing a counter in response to said measured vector and one of said reference vectors, respectively.

4. The method of claim 3, wherein the phase locking step comprises:
   calculating an error in 45 degrees phase shift between said one of said reference vectors and said measured vector and obtaining an error signal;
   integrating said error signal;
   adding a result of said integrating step with an output supplied by said counter to obtain an offset signal; and
   employing said offset signal to perform said generating step.

5. The method of claim 1, wherein said pair of reference vectors are, respectively, sine and cosine components of a vector generated by a voltage controlled oscillator.

6. The method of claim 5, further comprising providing a digitally implemented voltage controlled oscillator.

7. The method of claim 1, further comprising:
   mixing said measured vector with said one of said reference vectors;
   filtering a result of said mixing step with a low pass filter; and
   squaring a result of said filtering step.

8. The method of claim 7, further comprising:
   effecting said mixing, filtering and squaring steps for both of said reference vectors;
   adding the results of said respective mixing, filtering and squaring steps;
   extracting the square root of a result of said adding step; and
   amplifying a result of said extracting step,
   whereby a magnitude of said measured vector is obtained.

9. The method of claim 8, wherein said amplifying step comprises amplifying by a factor of two.

10. The method of claim 7, further comprising:
    effecting said mixing, filtering and squaring steps for both of said reference vectors;
    adding the results of said respective mixing, filtering and squaring steps;
    extracting the square root of a result of said adding step;
    inverting a result of said extracting step; and
    mixing a result of said inverting step with a projection of said measured vector on said one of said reference vectors,
    whereby a phase relationship between said measured vector and said one of said reference vectors is obtained.

11. The method of claim 1, further comprising the steps of:
    measuring at least two phases of said polyphase electrical system to obtain respective measured vectors;
    comparing the magnitudes of said measured vectors; and
    based on a result of said comparing step, controlling a switch to control which of different phase information associated, respectively, with said measured vectors, is used to effect said phase locking step.

12. The method of claim 1, further comprising:

acquiring a measurement of voltage and current magnitudes and phase angles for a plurality of phases of said polyphase electrical system; and calculating at least one of real power, reactive power, power factor and apparent power of said polyphase system.

13. The method of claim 1, wherein a number of phases in said polyphase system is three.

14. The method of claim 1, wherein said polyphase electrical system comprises an electrical generator.

15. A method of measuring and computing in real time under conditions of both balanced and unbalanced loads, at least one of a three phase system electrical power generator's instantaneous frequency, three line to line voltages, three phase currents, relative angles thereof, electrical power and power factor, comprising the steps of:

measuring at least one output signal of said generator;

generating reference sine and cosine components from a voltage controlled oscillator and phase locking an output of said voltage controlled oscillator to said output signal of said generator;

multiplying said output signal of said generator with said sine and cosine components, respectively;

filtering, respectively, the results of said multiplying step; and (a) squaring the results of said filtering step;
  summing the results of said squaring step and extracting the square root from the resulting sum; and
  amplifying a result of said extracting step to obtain the magnitude of said at least one output signal of said generator; and (b) inverting said result of said extracting step;
  multiplying a result of said inverting step with one of said results of said filtering step;
  clamping a product of said immediately preceding multiplying step to an absolute maximum of 1; and
  performing an arccosine function to obtain an angle between said at least one output signal of said generator and said cosine component.

16. The method of claim 15, further comprising maintaining said sine and cosine components at about a 45 degree angle with respect to said at least one output signal.

17. The method of claim 15, further comprising controlling an input signal for said voltage controlled oscillator by incrementing and decrementing a counter in response to said output signal of said generator and one of said reference sine and cosine components, respectively.

18. The method of claim 17, further comprising:

calculating an error in 45 degrees phase shift between said cosine component and the result of said clamping step and obtaining an error signal;

integrating said error signal;

adding a result of said integrating step with a count supplied by said counter to obtain an offset signal; and employing said offset signal to perform said generating step.

19. The method of claim 15, further comprising:

measuring the amplitude of at least two output signals of said generator to obtain respective measured amplitudes;

comparing at least one of the measured amplitudes to a predetermined threshold; and based on a result of said comparing step, controlling which of different phase information associated, respectively, with said at least two output signals, is used to effect said phase locking step.

20. The method of claim 15, further comprising calculating one line to line voltage based on two other line to line voltages of said three phase system.

21. The method of claim 15, further comprising providing a digitally implemented voltage controlled oscillator.

22. The method of claim 15, wherein said amplifying step comprises amplifying by a factor two.

23. An apparatus for analyzing a polyphase electrical system, comprising:

means for receiving a measured vector of at least one phase of said polyphase electrical system to obtain a measured vector;

means for generating a pair of reference vectors in quadrature;

means for phase locking said reference vectors at a predetermined angle out of phase with said measured vector; and means, operable based on a projection of said measured vector on one of said reference vectors, for calculating at least one of voltage or current magnitude, voltage or current phase and frequency of said polyphase electrical system.

24. The apparatus of claim 23, wherein said predetermined angle is about 45 degrees.

25. The apparatus of claim 23, further comprising means for counting zero crossings of said measured vector and one of said reference vectors, respectively.

26. The apparatus of claim 25, wherein said means for phase locking comprises:

means for calculating an error in 45 degrees phase shift between said one of said reference vectors and said measured vector and obtaining an error signal;

means for integrating said error signal; and means for adding a result of said means for integrating with a count supplied by said counter to obtain an offset signal.

27. The apparatus of claim 23, wherein said pair of reference vectors are, respectively, sine and cosine components of a vector generated by a voltage controlled oscillator.

28. The apparatus of claim 27, wherein said means for phase locking includes a digitally implemented voltage controlled oscillator.

29. The apparatus of claim 23, further comprising:

means for mixing said measured vector with said one of said reference vectors;

means, connected to said means for mixing, for filtering a result of said mixing step; and means, connected to said means for filtering, for squaring a result of said filtering step.

30. The apparatus of claim 29, further comprising:

means for mixing, filtering and squaring both of said reference vectors;

means, connected to said means for squaring, for adding results of said means for squaring;

means, connected to said to said means for adding, for extracting the square root of a result of said adding step; and means for multiplying a result of said means for extracting, whereby a magnitude of said measured vector is obtained.

31. The apparatus of claim 30, further comprising:
means for mixing, filtering and squaring both of said reference vectors;
means for adding the results of said means for mixing, filtering and squaring;
means for extracting the square root of a result of said means for adding;
means for inverting a result of said means for extracting; and
means for mixing a result of said means for inverting with said one of said reference vectors,
whereby a phase relationship between said measured vector and said one of said reference vectors is obtained.

32. The apparatus of claim 30, wherein said means for multiplying comprises means for multiplication by two.

33. The apparatus of claim 23, further comprising:
means for measuring at least two phases of said polyphase electrical system to obtain respective measured vectors;
means for comparing the magnitudes of said measured vectors; and
means, based on a result output by said means for comparing, for controlling a switch to control which of different phase information associated, respectively, with said measured vectors, is fed back to said means for phase locking.

34. The apparatus of claim 23, further comprising:
means for acquiring a measurement of voltage and current magnitudes and phase angles for a plurality of phases of said polyphase electrical system; and
means for calculating at least one of real power, reactive power, power factor and apparent power of said polyphase system.

35. The apparatus of claim 23, wherein a number of phases in said polyphase system is three.

36. The apparatus of claim 23, wherein said polyphase electrical system comprises an electrical generator.

37. An apparatus for measuring and computing in real time under conditions of both balanced and unbalanced loads, at least one of a three phase system electrical power generator's instantaneous frequency, three line to line voltages, three phase currents, relative angle between phases, electrical power and power factor, comprising:
means for receiving at least one output signal of said generator;
a voltage controlled oscillator (VCO) for generating reference sine and cosine components, said VCO being phase locked with said output signal of said generator;
multiplication blocks for multiplying said output signal of said generator with said sine and cosine components, respectively;
low pass filters for filtering, respectively, the results output by said multiplication blocks; and
  (a) squaring, summing and square root functions for obtaining the square root of the sum of the squares of outputs of said low pass filters; and
    an amplifier for amplifying the resulting square root; and
  (b) a divider for dividing the resulting square root; and another multiplication block for multiplying the result output by said divider with one of said results of said low pass filters;
    a clamping circuit for clamping an output from said another multiplication block to an absolute maximum of 1; and
    an arccosine function for operating on a result output from said clamping circuit.

38. The apparatus of claim 37, further comprising means for maintaining said sine and cosine components at about a 45 degree angle with respect to said at least one output signal.

39. The apparatus of claim 37, wherein an input signal for said VCO is controlled by at least one of incrementing and decrementing a counter in response to said output signal of said generator and one of said reference sine and cosine components, respectively.

40. The apparatus of claim 39, further comprising:
an error-in-45-degrees phase shift function for computing an error between said cosine component and the result of said clamping circuit and obtaining an error signal;
an integrator for integrating said error signal; and
an adder for adding an output of said integrator with a count supplied by said counter to obtain an offset signal,
wherein said phase of said VCO is set by said offset signal.

41. The apparatus of claim 37, further comprising:
means for measuring the amplitude of at least two output signals of said generator to obtain respective measured amplitudes;
means for comparing at least one of the measured amplitudes to a predetermined threshold; and
based on a result output from said means for comparing, controlling a switch to determine which of different phase information associated, respectively, with said at least two output signals, is used to supply said VCO.

42. The apparatus of claim 37, further comprising a negating block for calculating a third line to line voltage based on a first and a second line to line voltages of said three phase system.

43. The apparatus of claim 37, wherein said VCO is digitally implemented.

* * * * *